(12) United States Patent
Garnett

(10) Patent No.: US 7,385,797 B1
(45) Date of Patent: Jun. 10, 2008

(54) POWER PROBLEM DIAGNOSIS

(75) Inventor: Paul J. Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 470 days.

(21) Appl. No.: 10/855,829

(22) Filed: May 27, 2004

(51) Int. Cl.
*H02H 3/20* (2006.01)

(52) U.S. Cl. .................. 361/111; 361/91.1

(58) Field of Classification Search .......... 361/86, 361/87, 91.1, 93.1, 111, 18; 324/72, 102
See application file for complete search history.

(56) References Cited

U.S. PATENT DOCUMENTS

| | | | | |
|---|---|---|---|---|
| 3,333,247 A | * | 7/1967 | Hadley et al. | 713/600 |
| 3,629,852 A | * | 12/1971 | Thexton et al. | 324/102 |
| 3,633,101 A | * | 1/1972 | Johnson et al. | 324/102 |
| 3,633,852 A | * | 1/1972 | Forman et al. | 244/122 A |
| 5,684,710 A | | 11/1997 | Ehlers et al. | |
| 6,259,371 B1 | * | 7/2001 | Chang | 340/659 |
| 6,313,752 B1 | | 11/2001 | Corrigan et al. | |
| 6,452,373 B2 | * | 9/2002 | Medelius et al. | 324/72 |
| 6,819,539 B1 | * | 11/2004 | Wright et al. | 361/90 |
| 7,142,400 B1 | * | 11/2006 | Williams et al. | 361/18 |

* cited by examiner

*Primary Examiner*—Michael Sherry
*Assistant Examiner*—Danny Nguyen
(74) *Attorney, Agent, or Firm*—Meyertons Hood Kivlin Kowert & Goetzel, P.C.

(57) ABSTRACT

Apparatus for monitoring transient events in a power supply line the apparatus comprising a transient hold circuit having an input and an output wherein said input is arranged to be connected to said power supply line; and arranged to present at least one of a maximum and a minimum power value at said output; a time module adapted to allocate a time stamp to a detected power transient presented at said output; and a memory for storing said power transient and said corresponding time stamp.

14 Claims, 2 Drawing Sheets

POWER PROBLEM DIAGNOSIS

FIELD OF THE INVENTION

The present invention relates to apparatus and method for power supply fault diagnosis, and particularly for monitoring voltage transients in supply rails for computer systems.

BACKGROUND OF THE INVENTION

Voltage supplies to computer systems should ideally be consistently accurate and reliable and preferably without transients, such as voltage peaks and troughs, since these can cause faults in the operation of the computer system, for example hangs, panics and hard disc drive failures, causing undesirable interruptions and errors. Such failures often seem unrelated to power transients since accurate correlation is very difficult to establish. The number of separate voltage supply rails needed inside computer systems is increasing and at the same time the accuracy required for correct operation of the systems is rising.

Known systems monitor supply rails, for example using analogue-to-digital converters, but it is currently difficult usefully to correlate the data collected since this requires the operator constantly to monitor the converter output and, in any case, many problems seem unrelated unless they are persistent.

There is therefore a need for more exact monitoring of the voltage supply rails so as to provide more accurate information for fault diagnosis, and for monitoring in such a way that the information can be correlated to the faults arising.

SUMMARY OF THE INVENTION

The present invention provides apparatus for monitoring transient events in a power supply line, the apparatus comprising a transient hold circuit having an input and an output, wherein said input arranged to be connected to said power supply lines; and arranged to present at least one of a maximum and a minimum power value at said output; a timing module, adapted to allocate a time stamp to a detected power transient presented at said output; and a memory for storing said power transient and said corresponding time stamp.

Preferably a fast analogue-to-digital converter is connected between the output and the memory and a multiplexer is connected between the output and the analogue-to-digital converter. The transient hold circuit may comprise each of a peak hold and a trough hold circuit and may be reset when the detected power transient is stored in the memory. Fault or error events may be stored in a fault monitoring module with a corresponding time stamp and diagnosis performed to correlate the power transients with the error events.

A plurality of transient hold circuits may be provided, one for each of a plurality of power supply lines. The maximum and minimum power values may be within tolerance values for closer monitoring.

There is also provided a method for monitoring transient events in a power supply line comprising the steps of monitoring the power value on a power supply line, recording at least one of a maximum and a minimum power value, allocating a time stamp to the transient event and storing it.

DETAILED DESCRIPTION OF THE DRAWINGS

Figure 1:
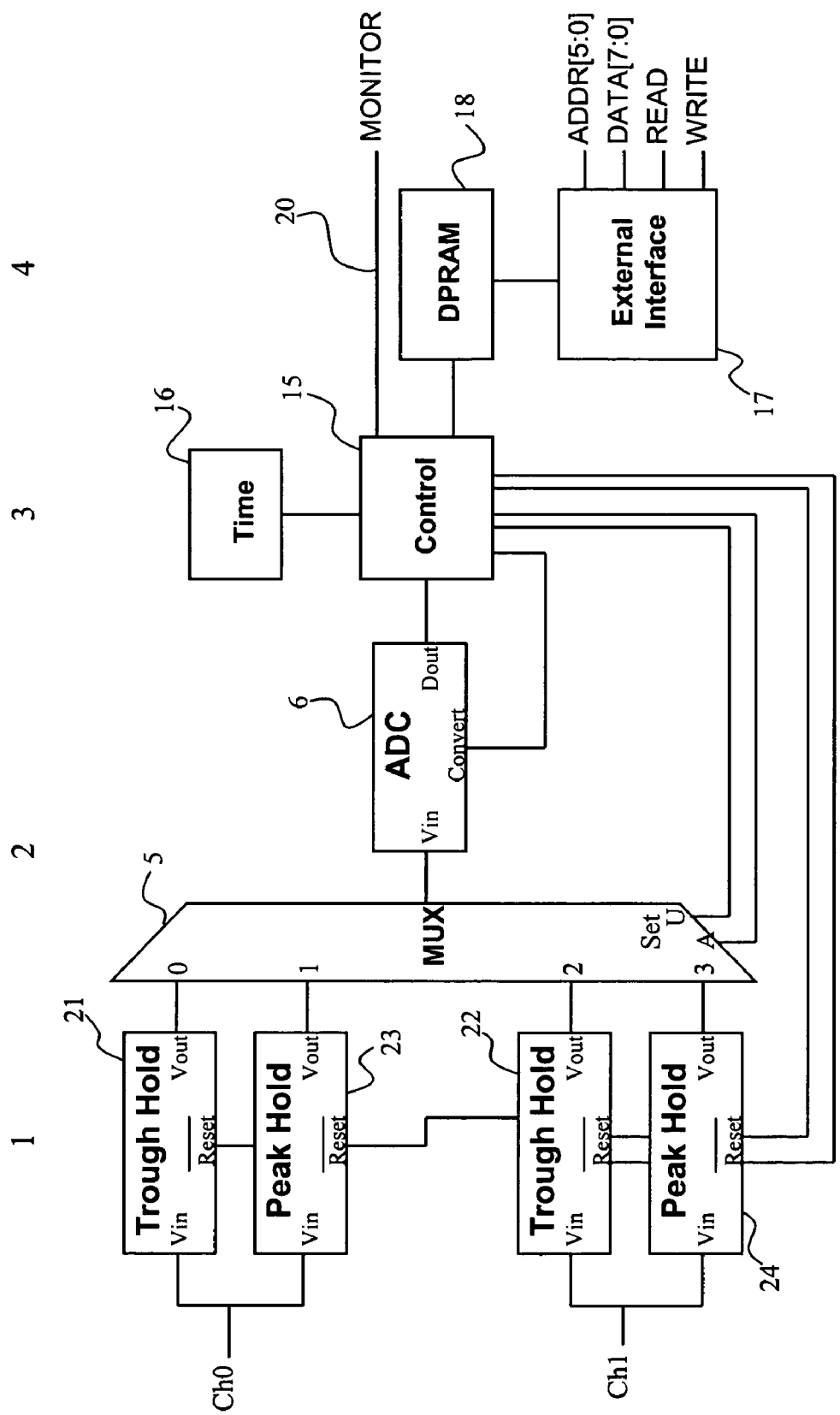
FIG. 1 is a schematic diagram of a power diagnostic circuit according to the present invention.

FIG. 1 shows a Power Diagnostic Engine (PDE) circuit composed of four parts: a peak/trough hold circuit 1, a data acquisition circuit 2, a timing and control circuit 3 and an external interface circuit 4.

The peak/trough hold circuit 1 is essentially an analogue circuit which holds on its outputs Vout the maximum (peak), and minimum (trough) values which it receives on its inputs Vin. The output values are captured by the data acquisition circuit 2 and then the peak/trough hold circuit 1 is reset by a control signal from the timing and control circuit 3. The external interface circuit 4 allows a host system to control the Power Diagnostic Engine and to read, record and correlate the results of a sampling exercise.

The peak/trough hold circuit 1 comprises circuitry on each input channel to sample each power signal and capture respective peaks and troughs. In the example illustrated there are two power channels Ch0 and Ch1. A first trough hold module 21 and a first peak hold module 23 is connected to the first channel Ch0. A second trough hold module 22 and a second peak hold module 24 is connected to the second channel Ch1.

Trough and peak hold modules are well known and can be implemented in many ways. Examples of standard modules are and also as described in The Art of Electronics by Horowitz and Hill, published by Cambridge University Press, and typical modules are manufactured by Linear Technology, e.g., their model LT1190.

Figure 2:
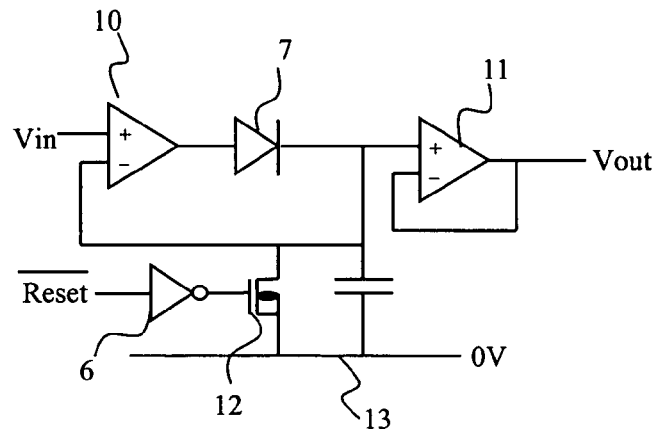
FIG. 2 is a more detailed circuit diagram of a part of the circuit of FIG. 1, showing a peak hold circuit.

One example of a peak hold module 21 is shown in FIG. 2 comprising first op amp 10 arranged as a computer, connected by a diode 7 to a second op amp 11 connected as a buffer. The voltage to be monitored is applied at Vin to the positive input of the first op amp 10 and the maximum voltage is held at the output Vout of the second op amp 11. A reset signal is applied via inverter 6 to the gate electrode of a FET 12 connected to ground 13.

Figure 3:
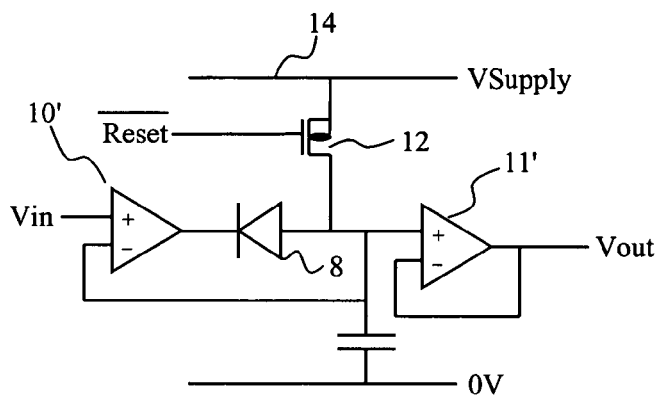
FIG. 3 is a more detailed circuit diagram of a part of the circuit of FIG. 1, showing a trough hold circuit.

In FIG. 3 a typical trough-hold module 23 is shown. Again two op amps 10', 11' are connected but this time via a diode 8. The voltage being monitored is applied at Vin to the positive input of the first op amp 10' and the minimum level is held at the output Vout of the second op amp 11' until a reset signal is applied to the gate electrode of a FET 12', this time arranged to connect the op amps 10', 11' to the high voltage rail 14.

The data acquisition circuit 2 comprises an analogue multiplexer (MUX) 5 which samples each output Vout from the peak/trough hold circuit 1, on a periodic basis, using an analogue to digital converter (ADC) 6. This is done under the control of the control circuit 3 and as each of the outputs Vout from the peak/trough hold circuit 1 have been sampled then the respective peak and trough hold modules 21, 23 and 22, 24 are reset.

It is advantageous to capture the output values Vout because the hold modules 21-24 are unable to hold maximum or minimum values indefinitely due to leakage in the analogue circuitry.

In the example shown, only one ADC 6 is used for multiple input channels Ch0 and Ch1 but equally a separate ADC may be used for each channel, i.e., for each pair of peak/trough modules, or one ADC for each individual hold module.

For this example the ADC 6 has an accuracy of 10 bits but greater or lesser accuracy could be used. Typically the ADC would have an internal reference voltage but this is not essential.

The control circuit 3 co-ordinates the operation of the other circuits 1 and 2, compares results, and controls the output of data to the external interface circuit 4. It could comprise a microprocessor or could be implemented as a state machine in hardware.

The control circuit 3 comprises a control block 15 and also a timing block 16, which provides a reference to allow correlation with external events, such as external power failures, to facilitate accurate diagnosis. Typically the timing block 16 would represent the actual time as a 4 byte value representing the number of milliseconds since midnight (0:00:00:000) and will increment every millisecond.

The control circuit 3 will be instructed by a host system, for example to initialise the sampling and to determine when the monitoring device should operate. For example, the monitoring device should be disabled when power supplies are turned on or off to allow supply rails to stabilise. This is controlled by external signals to a monitor input 20 of the control block 15.

It would also be possible to use a more complex implementation to calculate the voltage gradient (dv/dt) for each input and store peak negative and positive going transitions and the time at which they occur.

The external interface circuit 4 comprises a memory block 18 and external interface block 17. The memory block 18 is typically Dual Port RAM (DPRAM) which is initialised with maximum values to the trough locations and minimum values to the peak locations before the system has started running. It is updated by the control block 15 of the control circuit 3.

A typical arrangement of data values in the DPRAM 18 would be:

| Address | 4 bytes | 4 bytes |
|---|---|---|
| 0 | Channel 0 Trough Value | Channel 0 Trough Time |
| 8 | Channel 0 Peak Value | Channel 0 Peak Time |
| 16 | Channel 1 Trough Value | Channel 1 Trough Time |
| 24 | Channel 1 Peak Value | Channel 1 Peak Time |

A typical functionality for the control block 15 in pseudocode would be:

Integer channel, new_value;

WHILE (Monitor==1)

FOR channel=0 to 1 set_mux (channel, TROUGH)

ADC_convert 0, new value=ADC_Result 0;

if (new_value<DPRAM (channel, TROUGH). value)

then

DPRAM (channel, TROUGH) value=new_value;

DPRAM (channel, TROUGH). time=Time_now ( );

Endif

Set mux (channel, PEAK);

ADC_convert 0;

new_value=ADC_Result;

if (new_value>DPRAM (channel, PEAK). value)

then

DPRAM (channel, PEAK). value=new_value;

DPRAM (channel, PEAK). value=Time_now 0;

Endif

Reset_PTH (Channel);

NEXT channel

END_WHILE

Figure 4A:
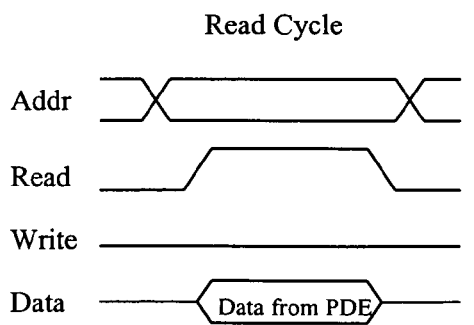
FIGS. 4a and 4b are timing diagrams for a read and write cycle respectively of part of the circuit of FIG. 1.
Figure 4B:
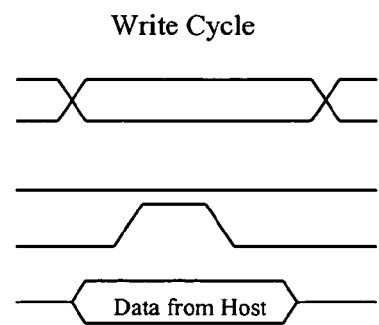

The external interface block 17 could comprise a simple I²C interface or a complex PCI interface. In the example shown, a generic, asynchronous 8 bit wide bus interface is used and typical timing diagrams are shown in FIG. 4a for the read cycle, and in FIG. 4b for the write cycle.

This external interface block 17 allows the host system to read and write the contents of the DPRAM 18 and, using additional locations in the DPRAM, allows commands to be passed to the control circuit 3, e.g. to set the time in the timing block 16.

All or most elements in this monitoring arrangement could be integrated in a single monolithic device and used to replace typical current I²C devices to monitor and continuously capture and measure voltage supply transients, correlate them with error events and analyse the correlation during product development as well as during deployment of products. Such data can then be used in future diagnostics and to improve product development and deployment. With accurate correlation between transient and error events predictions can be made of future events and steps taken to minimise or avoid them.

This arrangement can capture out-of-specification transient events as well as within-specification events. The appropriate values are set in the DPRAM and can be changed by the host system depending upon the application.

What is claimed is:

1. An apparatus for monitoring transient events in a power supply line, the apparatus comprising:
 a transient hold circuit having an input and an output, wherein said input is arranged to be connected to said power supply line; and arranged to present at least one of a maximum and a minimum power value indicative of a power transient at said output; wherein the transient hold circuit includes:
 at least one trough hold module configured to detect and hold the minimum power value; and
 at least one peak hold module configured to detect and hold the maximum power value;

wherein the at least one trough hold module and at least one peak hold module are independently resettable with respect to each other;

a memory coupled to each of the peak hold and trough hold circuits and adapted to store said power transient; and a timing module, adapted to allocate a time stamp to a detected power transient presented at said output.

2. An apparatus to claim 1 wherein said memory is adapted to store said time stamp corresponding to said power transient.

3. An apparatus according to claim 1 further comprising an analogue-to-digital converter connected between said output and said memory.

4. An apparatus according to claim 3 further comprising a multiplexer connected between said transient hold circuit output and said analogue-to-digital converter.

5. An apparatus according to claim 1 further comprising a control module arranged to control resetting of the transient hold circuit when said power transient has been stored in said memory.

6. An apparatus according to claim 1 comprising a control module arranged to control resetting of said at least one peak-hold module and said at least one trough-hold module independently of each other when a power transient has been stored in said memory.

7. An apparatus according to claim 1 wherein said transient hold circuit comprises a plurality of transient hold modules for monitoring a respective plurality of power supply lines.

8. An apparatus according to claim 1 wherein said maximum and minimum power values are outside respective out-of-tolerance values.

9. An apparatus according to claim 1, wherein the peak hold module comprises:
a first operational amplifier;
a second operational amplifier;
a diode coupled between the first operational amplifier and the second operational amplifier, wherein an anode of the diode is coupled to an output of the first operational amplifier and a cathode of the diode is coupled to a non-inverting input of the second operational amplifier;
a capacitor coupled between the non-inverting input of the second operational amplifier and a ground node; and
a field effect transistor (FET) having a gate terminal, a first terminal coupled to an inverting input of the first operational amplifier and a second terminal coupled to the ground node, wherein the peak hold module is configured to be reset by applying a reset signal to the gate terminal.

10. An apparatus according to claim 1, wherein the trough hold module comprises:
a first operational amplifier;
a second operational amplifier;
a diode coupled between the first operational amplifier and the second operational amplifier, wherein a cathode of the diode is coupled to an output of the first operational amplifier and an anode of the diode is coupled to a non-inverting input of the second operational amplifier;
a capacitor coupled between then non-inverting input of the second operational amplifier and a ground node; and
a field effect transistor (FET) having a gate terminal, a first terminal coupled to the non-inverting input of the second operational amplifier, and a second terminal coupled to a power supply node, wherein the trough hold module is configured to be reset by applying a reset signal to the gate terminal.

11. A method for monitoring transient events in a power supply line comprising:
monitoring the power value on a power supply line;
determining at least one of a maximum power value or a minimum power value, wherein a peak hold module is used to detect the maximum power value, and wherein a trough hold module is used to detect the minimum power value;
storing at least one of the maximum and minimum power values; wherein the at least one of the maximum and minimum power values are indicative of a transient power event;
independently resetting each of the peak hold module and the trough hold module subsequent to said storing; and
allocating a time stamp to the transient power event and recording the time stamp with the corresponding transient power event.

12. A method according to claim 11 further comprising monitoring voltage gradients on the power supply line and storing them with a corresponding time stamp.

13. An apparatus for monitoring transient events in a power supply line, the apparatus comprising:
a transient hold circuit having an input and an output, wherein said input is arranged to be connected to said power supply line; and arranged to present at least one of a maximum and a minimum power value indicative of a power transient at said output; wherein the transient hold circuit includes:
at least one trough hold module configured to detect and hold the minimum power value; and
at least one peak hold module configured to detect and hold the maximum power value;
wherein the at least one trough hold module and at least one peak hold module are independently resettable with respect to each other;
a memory coupled to each of the peak hold and trough hold circuits and adapted to store said power transient;
an analogue-to-digital converter connected between said output and said memory; and
a multiplexer connected between said transient hold circuit output and said analogue-to-digital converter.

14. A method for monitoring transient events in a power supply line comprising:
monitoring the power value on a power supply line;
determining at least one of a maximum power value or a minimum power value, wherein a peak hold module is used to detect the maximum power value, and wherein a trough hold module is used to detect the minimum power value;
storing at least one of the maximum and minimum power values; wherein the at least one of the maximum and minimum power values are indicative of a transient power event;
independently resetting each of the peak hold module and the trough hold module subsequent to said storing; and
monitoring voltage gradients on the power supply line and storing them with a corresponding time stamp.

* * * * *